(12) United States Patent
Kessels et al.

(10) Patent No.: US 11,946,640 B2
(45) Date of Patent: Apr. 2, 2024

(54) MULTI-COLOR LED LIGHT SOURCE WITH PLURALITY OF PHOSPHOR FILLINGS

(71) Applicant: LUMILEDS LLC, San Jose, CA (US)

(72) Inventors: Marcus Jozef Henricus Kessels, Echt (NL); Ton Theunissen, Koningsbosch (NL); Ralph Hubert Peters, Kerkrade (NL); Georg Henninger, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 17/925,563

(22) PCT Filed: May 14, 2021

(86) PCT No.: PCT/US2021/032558
§ 371 (c)(1),
(2) Date: Nov. 15, 2022

(87) PCT Pub. No.: WO2021/231932
PCT Pub. Date: Nov. 18, 2021

(65) Prior Publication Data
US 2023/0194069 A1    Jun. 22, 2023

Related U.S. Application Data

(60) Provisional application No. 63/025,645, filed on May 15, 2020.

(30) Foreign Application Priority Data

Jul. 20, 2020 (EP) .................................... 20186732

(51) Int. Cl.
*H01L 33/44* (2010.01)
*F21V 9/45* (2018.01)
(Continued)

(52) U.S. Cl.
CPC ................ *F21V 9/45* (2018.02); *F21V 23/06* (2013.01); *F21Y 2105/10* (2016.08); *F21Y 2115/10* (2016.08)

(58) Field of Classification Search
CPC ....... H01L 33/44; H01L 33/50; H01L 33/502; H01L 33/504; H01L 33/52; H01L 23/3135; H01L 23/31; H01L 25/042; H01L 27/12
(Continued)

(56) References Cited

U.S. PATENT DOCUMENTS 4,992,704 A * 2/1991 Stinson .................. H05B 45/40
362/800
7,352,011 B2 4/2008 Smits et al.
(Continued)

FOREIGN PATENT DOCUMENTS

EP       2645418 A2    10/2013
JP    2014-049504 A     3/2014
(Continued)

OTHER PUBLICATIONS

International Search Report and Written Opinion dated Sep. 2, 2021 for PCT International Application No. PCT/US2021/032558.
(Continued)

*Primary Examiner* — Ismael Negron
(74) *Attorney, Agent, or Firm* — Volpe Koenig

(57) ABSTRACT

A light source includes a first light emitting diode (LED) die configured to emit a first die color and a second LED die configured to emit a second die color, the first and second LED dies provided on a substrate. A first filling covering the first LED die, and includes a first phosphor to convert the first die color to a first illuminous color. A second filling covering the second LED die and extending to the first filling, and includes a second phosphor to convert the second
(Continued)

die color to a second illuminous color that has a higher absorption energy than an illumination energy of the first illuminous color.

18 Claims, 8 Drawing Sheets

(51) Int. Cl.
*F21V 23/06* (2006.01)
*F21Y 105/10* (2016.01)
*F21Y 115/10* (2016.01)

(58) Field of Classification Search
USPC ....... 257/88, 89, 98; 313/487, 498, 500–502
See application file for complete search history.

(56) References Cited

U.S. PATENT DOCUMENTS

| | | | |
|---|---|---|---|
| 7,679,281 B2 * | 3/2010 | Kim | F21K 9/00 |
| | | | 257/98 |
| 7,847,303 B2 * | 12/2010 | Jung | F21K 9/64 |
| | | | 257/89 |
| 8,044,587 B2 * | 10/2011 | Jung | H01L 25/0753 |
| | | | 313/503 |
| 8,071,988 B2 * | 12/2011 | Lee | H01L 25/0753 |
| | | | 257/89 |
| 8,183,583 B2 * | 5/2012 | Jung | H01L 25/0753 |
| | | | 257/89 |
| 8,188,492 B2 * | 5/2012 | Lee | C09K 11/77922 |
| | | | 257/89 |
| 8,247,825 B2 * | 8/2012 | Ku | F21V 7/30 |
| | | | 257/E33.059 |
| 8,319,252 B2 * | 11/2012 | Liu | H01L 25/0753 |
| | | | 257/98 |
| 8,344,411 B2 * | 1/2013 | Chou | H01L 25/0753 |
| | | | 257/89 |
| 8,348,457 B2 * | 1/2013 | Kadotani | H05B 45/40 |
| | | | 257/79 |
| 8,471,284 B2 * | 6/2013 | Lai | H01L 25/0753 |
| | | | 257/E33.059 |
| 8,579,451 B2 * | 11/2013 | Galvez | F21V 9/38 |
| | | | 362/84 |
| 8,670,087 B2 | 3/2014 | Shin | |
| 8,740,400 B2 * | 6/2014 | Tao | C09K 11/77344 |
| | | | 362/293 |
| 8,835,953 B2 * | 9/2014 | Liu | H01L 25/0753 |
| | | | 257/98 |
| 8,899,767 B2 | 12/2014 | Harbers et al. | |
| 9,072,148 B2 * | 6/2015 | Tanaka | H05B 33/12 |
| 9,905,737 B2 * | 2/2018 | Soer | H01L 25/0753 |
| 10,186,642 B2 * | 1/2019 | Lee | H01L 33/52 |
| 10,522,518 B2 * | 12/2019 | Ng | H01L 25/0753 |
| 10,971,659 B2 * | 4/2021 | Xu | H01L 33/504 |
| 11,002,427 B2 * | 5/2021 | Iwasa | H01L 33/501 |
| 11,114,594 B2 * | 9/2021 | Chakraborty | H01L 33/56 |
| 11,611,020 B2 * | 3/2023 | Byun | C09K 11/7734 |
| 11,631,792 B2 * | 4/2023 | Zhou | H01L 33/60 |
| | | | 257/88 |
| 2004/0135504 A1 * | 7/2004 | Tamaki | C09K 11/0883 |
| | | | 313/512 |
| 2007/0223219 A1 | 9/2007 | Medendorp, Jr. et al. | |
| 2008/0048193 A1 * | 2/2008 | Yoo | H01L 25/0753 |
| | | | 257/E33.056 |
| 2009/0050912 A1 * | 2/2009 | Chu | H01L 25/0753 |
| | | | 257/89 |
| 2010/0025700 A1 | 2/2010 | Jung et al. | |
| 2011/0309390 A1 | 12/2011 | Liu et al. | |
| 2018/0313514 A1 | 11/2018 | Lee | |

FOREIGN PATENT DOCUMENTS

| | | |
|---|---|---|
| KR | 2011-0075835 A | 7/2011 |
| WO | 2015/110875 A1 | 7/2015 |
| WO | 2016/173761 A1 | 11/2016 |

OTHER PUBLICATIONS

International Preliminary Report on Patentability Chapter I dated Nov. 15, 2022 for PCT International Application No. PCT/US2021/032558.
Extended European Search Report dated Dec. 15, 2020 for European Patent Application No. 20186732.2.

* cited by examiner

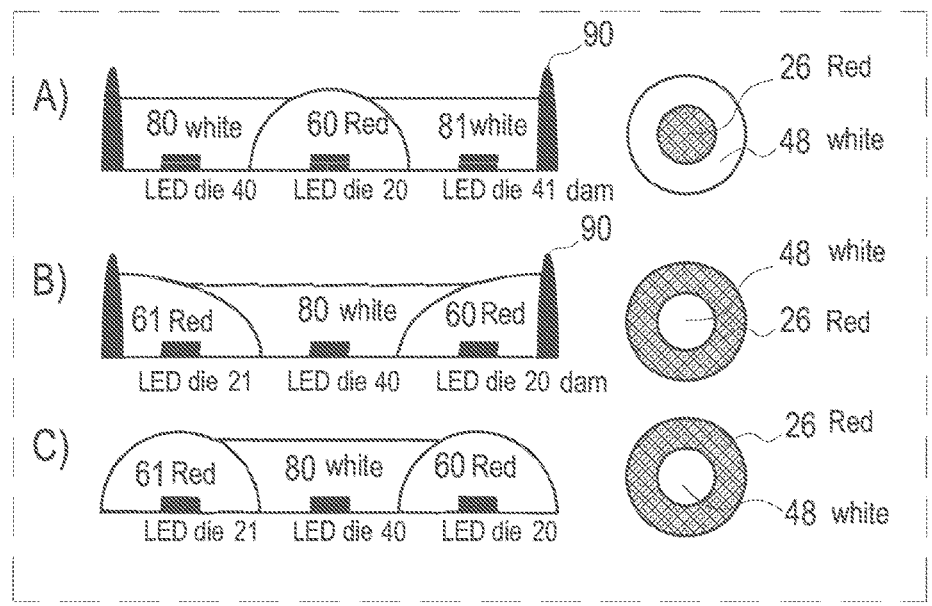
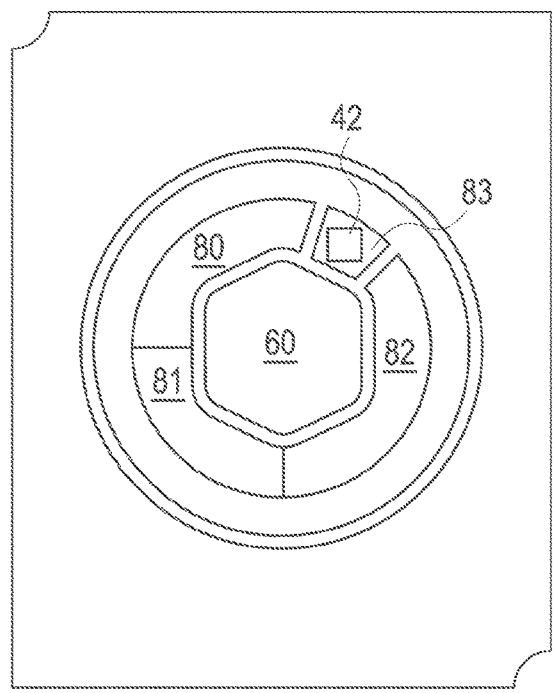
Fig. 4A - 4C
Fig. 4D

MULTI-COLOR LED LIGHT SOURCE WITH PLURALITY OF PHOSPHOR FILLINGS

CROSS REFERENCE TO RELATED APPLICATIONS

This application is a § 371 application of International Application No. PCT/US2021/032558, filed May 14, 2021, which claims the benefit of U.S. Provisional Patent Application Number 63/025,645, which was filed on May 15, 2020, and European Patent Application Number 20186732.2, which was filed on Jul. 20, 2020, the contents of which are hereby incorporated by reference herein.

BACKGROUND

A Daytime Running Lamp (DRL) may be a mandatory lighting device that may be automatically switched on when a vehicle is driving on the road. According to, for instance, European Union (EU) regulations, DRL lights must be kept on during driving, which may necessitate the development of multi-function lighting modules equipped on the vehicles. Common combinations of lightning functions include a DRL/Turn combination and a Backup/Turn combination, for example. To realize such combinations, multi-color light sources may be employed. For a DRL/Turn module, for example, a two-color light source may be required.

SUMMARY

Methods, apparatus and systems are described herein. A light source includes a first light emitting diode (LED) die configured to emit a first die color and a second LED die configured to emit a second die color. A first filling is disposed over the first LED die. The first filling has a convex surface and includes a first phosphor such that the first die color is converted to a first illuminous color. A second filling is disposed over the second LED die. The second filling includes a second phosphor such that the second die color is converted to a second illuminous color that has a higher absorption energy than an illumination energy of the first illuminous color.

BRIEF DESCRIPTION OF THE DRAWINGS

A more detailed understanding can be had from the following description, given by way of example in conjunction with the accompanying drawings wherein:

FIG. 4 is a diagram showing three embodiments of multi-color light sources;

DETAILED DESCRIPTION

Figure 1:
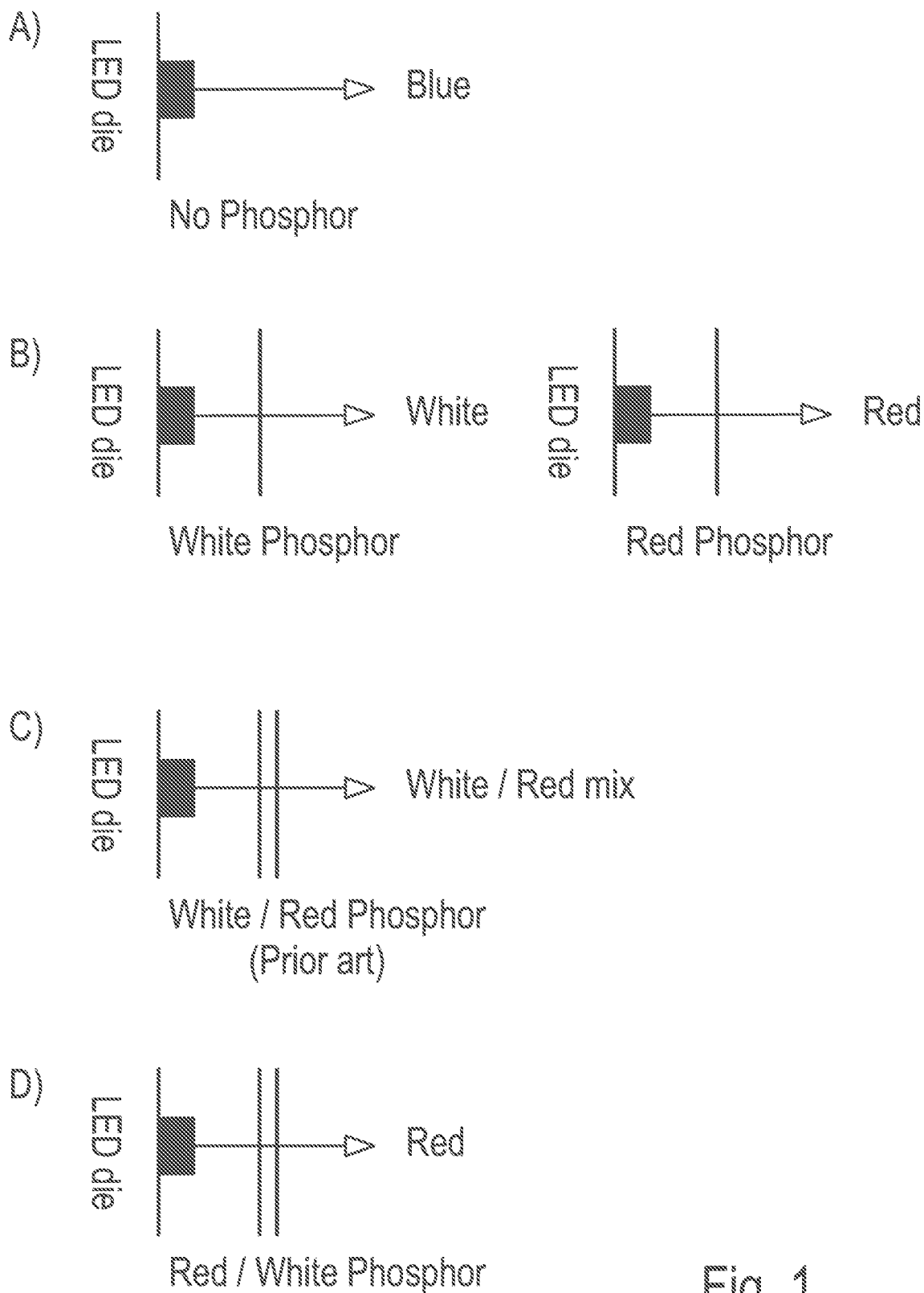
FIG. 1 is a diagram showing the illuminous colors perceived by the viewers for various color combinations for a two-color light source.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper," "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

For the production of multi-color light sources, it may be most cost effective to use a Chip-on-Board (CoB) technology. For CoB technology, instead of packaging the individual semiconductor devices that comprise respective light emitting diodes (LEDs) separately, multiple LED chips (or dies) may be directly bonded to a substrate, such as a printed circuit board (PCB), such that a single module containing a number of LED chips is formed. This may reduce the space and weight of the device as well as the costs during the manufacturing process. More specifically, for the production of a two-color light source, multiple strings of LED dies may be mounted on a substrate, following which one part of the LED die strings may be covered by one filling containing a certain type of color converting phosphor while another part of the LED die strings is covered by another filling containing another type of color converting phosphor. The two parts of the LED die strings may employ blue LED dies such that, after being converted by their respective fillings, the respective illuminous colors perceived by viewers for the two parts of the LED die strings are different from each other (e.g., white and red). However, the closeness of the two parts of the LED die strings may increase the possibility of mixture of the lights such that viewers may perceive mixed colors.

FIG. 1 is a diagram showing the illuminous colors perceived by viewers for various color combinations for a two-color light source. As shown in FIG. 1A, a blue LED die color with no phosphor may appear as a blue illuminous color to the viewer. As shown in FIG. 1B, a white phosphor may convert a blue LED die color to white, and a red phosphor may convert the blue LED die color to red. As is mentioned above, in order to render two distinct colors, two different phosphors may be needed. However, a certain degree of color mixture may take place if the blue color emitted by the LED die firstly goes through a white phosphor and then goes through a red phosphor. For instance, as is shown in FIG. 1C, what is rendered is a mix of white and red (thus pink), and not two distinct colors. This is due, for example, to the blue portion of the white color being converted by the red phosphor. Thus, for distinct colors, the phosphors may need to be placed next to each other. Typically, this is done by placing a dam between the two phosphors.

Accordingly, it may be desirable to efficiently avoid mixture of colors in the multi-color light source products. Additionally, it may also be desirable that the multi-color light source products are more compact and less costly and be produced by manufacturing processes that are more efficient.

Figure 2:
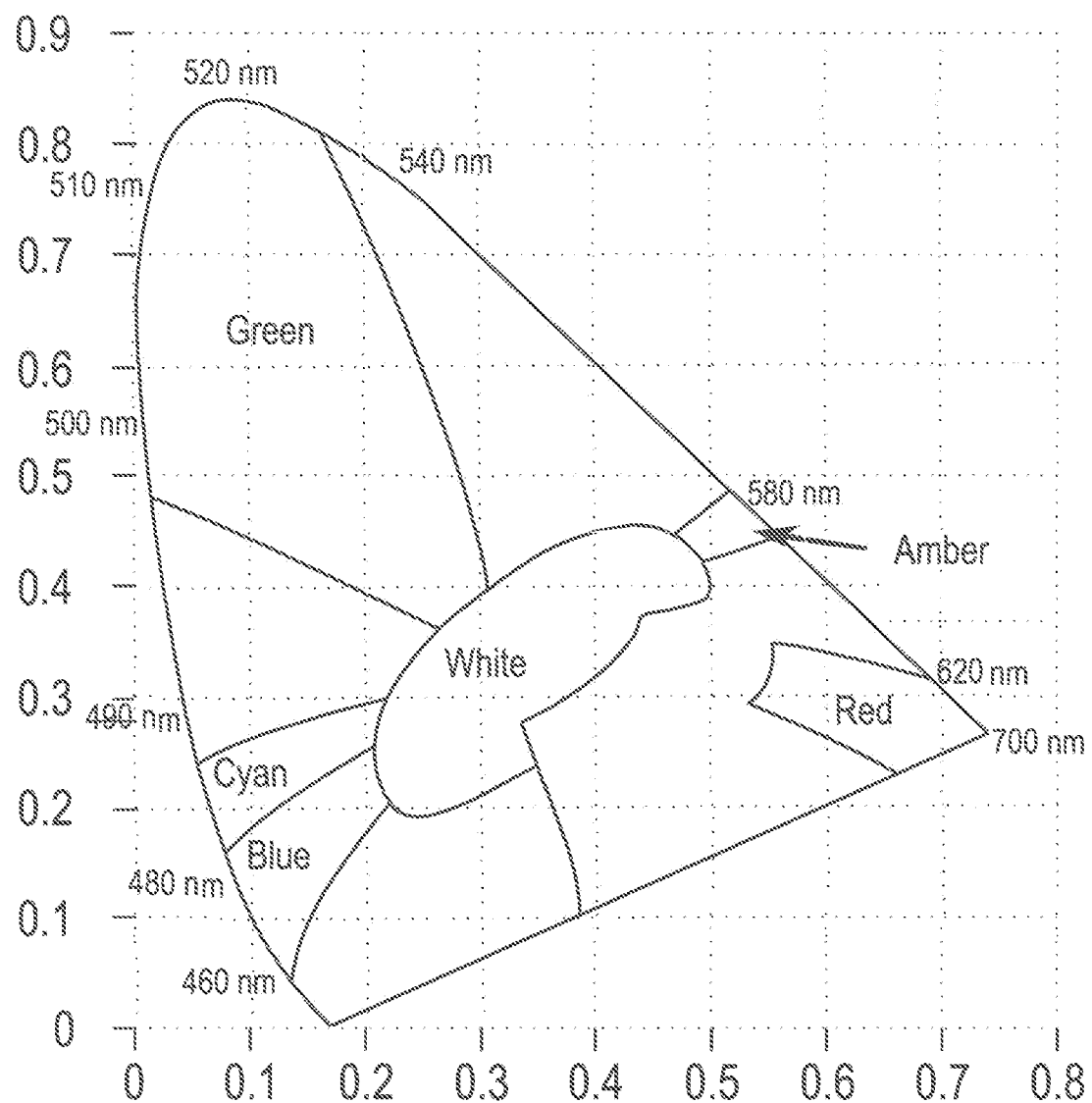
FIG. 2 is a diagram of a color space of visible light spectrum.

Referring back to FIG. 1C, the mix of colors in the illuminous color may occur because the color point of red in the color space is farther away from the color point of blue compared with the color point of white. In this regard, reference is made to FIG. 2. FIG. 2 is a diagram of a color space of visible light spectrum wherein the color points of red, amber, green, cyan, blue and white are illustrated. In FIG. 2, it is shown that the distance between the color point of blue and the color point of red is greater than that between blue and white. Thus, as illustrated in FIG. 1D, if the blue color encounters firstly the red phosphor and then the white phosphor, the illuminous light that comes out from the white phosphor is still in the color of red. The reason for that is that the converted red color may not undergo any conversion anymore when it passes through the white phosphor.

Figure 3:
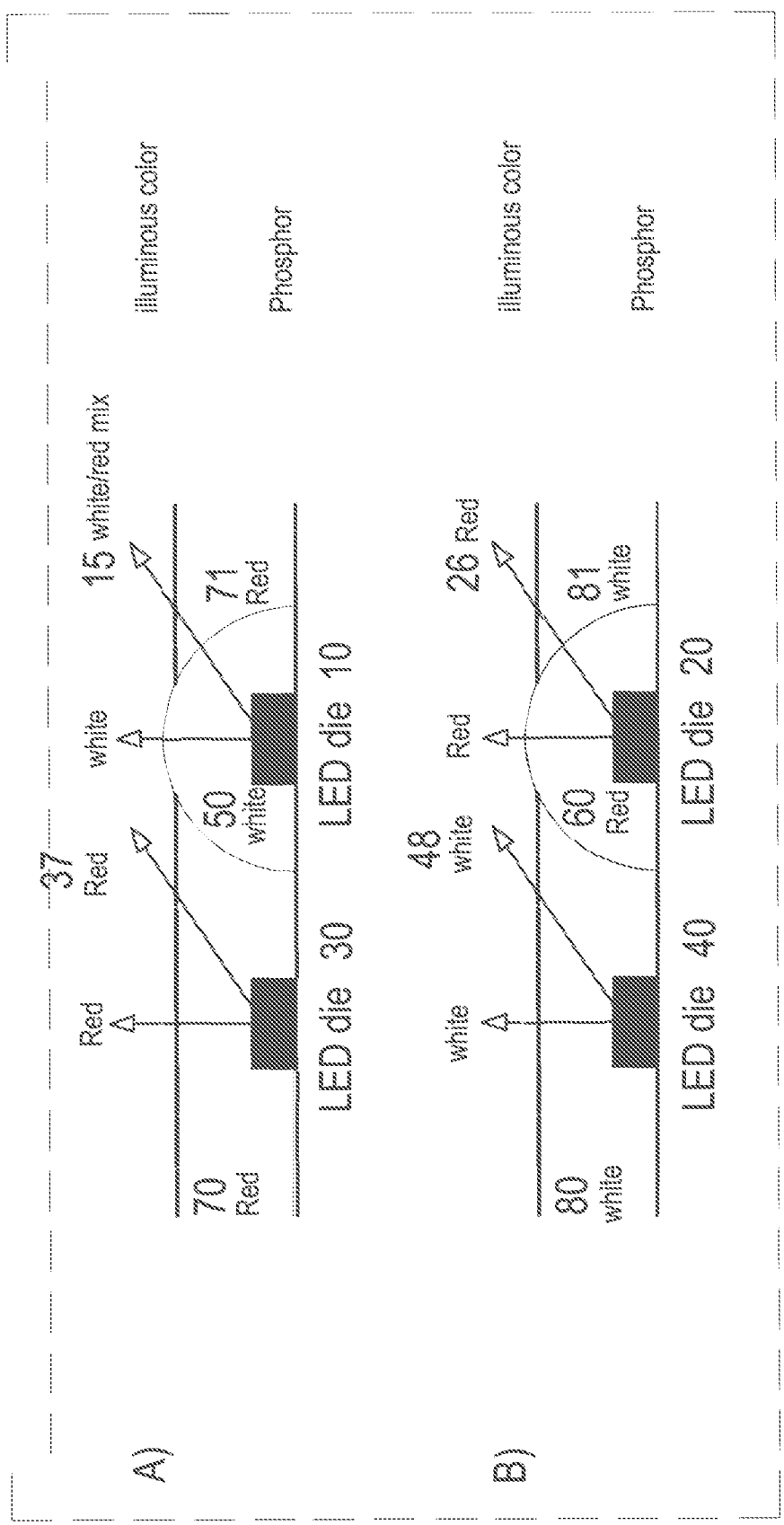
FIG. 3 is a cross-sectional view of two multi-color light sources with two different arrangements of phosphors.

FIG. 3 is a cross-sectional view of two multi-color light sources with two different arrangements of the phosphors. Referring to FIG. 3A, an LED die 10 may be covered by a filling 50 containing a white phosphor and another LED die 30 may be covered by another filling 70 containing a red phosphor. Similar to the filling 70, there may also be a filling 71 containing a red phosphor and covering another LED die (not shown in FIG. 3A). The first die color and the second die color may thus each be converted to a respective illuminous color by passing through a respective phosphor. As is illustrated in FIG. 3A, a white illuminous color 15 coming out from the white phosphor may still get converted by the red phosphor in the filling 71, which may result in an undesired mix of white and red illuminous colors.

In the two examples illustrated in FIG. 3, blue colored LED dies are used as an example, which is not intended to limit the present invention. As mentioned above, white may be a mix of at least two wavelengths (e.g., blue (~450 nm) and yellow (~560 nm)). Therefore, according to the color regions shown in FIG. 2, the undesired mix may take place because of reabsorption of white in the red phosphor since white contains light with a higher energy (shorter wavelength). Hence, the white illuminous color 15, when encountering the red phosphor, may still be converted to a red illuminous color.

By contrast, FIG. 3B illustrates that, according to embodiments described herein, such an undesired mix can be avoided. In the example illustrated in FIG. 3B, a first LED die 20 is covered by a first filling 60 containing a first phosphor, which may be a red phosphor, and a second LED die 40 is covered by a second filling 80, 81 containing a second phosphor, which may be a white phosphor. In embodiments, a light source may include more than one first LED dies 20 and more than one second LED dies 40. In embodiments, the first LED die and the second LED die may be separated by a distance. The distance may be, for example, less than 50 mm, less than 20 mm or even less than 10 mm.

The first die color and the second die color may each be converted to a respective illuminous color by passing through a respective phosphor. In addition, the second filling 80 is arranged in FIG. 3B to the left of the first filling 60 whereas another portion of the second filling (81) is arranged to the right of the first filling 60. However, in some embodiments, the filling 81 may cover another LED die (not shown in FIG. 3B). In the example illustrated in FIG. 3B, since the first die color is blue, and is already converted by the first phosphor to a first red illuminous color 26, the further encounter of the first illuminous color 26 with the second filling 81 may not induce any color conversion anymore. Thus, the arrangement of the first LED die together with the first filling as well as the second LED die together with the second filling may ensure that the first illuminous color does not get converted even if the first illuminous color encounters the second phosphor.

The first die color and the second die color may refer to the respective colors that may be directly emitted by the first LED die and the second LED die. In examples described herein, both the first die color and the second die color are blue. Blue may be a desirable choice for the first die color and the second die color because blue gives enough energy to be shifted to almost any other color point. It is evident, however, that the skilled person understands that the colors of the LED dies can be the same or different and further can be other colors such as, but not limited to, red, green and cyan. The second die color can be equal or nearly equal to the first die color. Thus, taking the case where the first die color and the second die color are blue as an example, the first illuminous color can also be amber when the second illuminous color is white. Further, the first illuminous color can be any one of white, red and amber whereas the second illuminous color can be cyan. The skilled person understands that he can select within his expertise different combinations of colors according to the color regions illustrated in FIG. 2.

Still referring to FIG. 3B, it is shown that the first filling 60 is waterdrop shaped and has a convex surface. This may be advantageous in that the second illuminous color 48, along its three-dimensional propagation path, may still encounter the first filling 60 such that portions of the second illuminous color 48 further get converted by the first phosphor to the first illuminous color red. Therefore, by configuring a convex surface of the first filling 60, the rays of the second illuminous color 48, which would otherwise get converted, can pre-dominantly pass over the convex surface of the first filling 60 and thus not pass through the first filling 60. As mentioned above, the portion of the second illuminous color 48 transmitting from the right side of the second LED die 40 toward the left lower part of the surface of the first filling 60 (this portion of the second illuminous color 48 is not shown in FIG. 3B), which although might transmit through the first filling 60, is negligible. What the observing eyes perceive is a distinct color separation.

It is evident that the curvature of the convex surface or the specific radius of the waterdrop shape of the first filling 60 can be selected by the person skilled in the art according to the distance between the first LED die 20 and the second LED die 40 and the diameter of the sphere formed by the first filling 60, which may also be related to the characteristics of the material applied in the first filling 60, such as the thickness of the filling and/or phosphor material. For example, the surface tension of the applied fillings may be adapted to control the shape of the convex surface. This description is not intended to limit the skilled person in his choices of the material of the fillings as well as the specific parameters concerning the LED dies during his specific manufacturing process and can be adapted according to different manufacturing and lighting requirements.

In summary, as is illustrated in FIG. 3B, the configuration of the first LED die, the second LED die, the first filling as well as the second filling may ensure that the first illuminous color does not get converted by the second phosphor contained in the second filling. Further, the arrangement that the first illuminous color having a lower energy than the absorption energy of the second phosphor may ensure that even if the first illuminous color has to physically go through the second phosphor, no color conversion may take place anymore such that the first illuminous color and the second illuminous color are separate, which may mean that the observing eyes of viewers can perceive a distinct multi-color light pattern where the colors are distinguished as being separated or spatially separated from each other. For example, at different locations, different, distinct colors may be visible. Since the second illuminous color may pass over the first filling, the second illuminous color may not be transmitted through the first filling such that no, or almost no, color conversion can take place in the first filling. In particular, the eyes that are observing from the outside of, or mostly from above of, the light source can discern a two-color light pattern. It could be that a portion of the second illuminous color transmitted from, for example, the lower side of the second LED die, might transmit through the first filling, the amount of such a side transmission compared with that of non-side transmission may be ignorable such that the eyes' distinguishing two separate and distinct colors may not be interfered with. In other words, since the second illuminous color pre-dominantly passes over the first filling, the separation of the first illuminous color and the second illuminous color may be improved.

Regarding the illumination energy of the first illuminous color being lower than an absorption energy of the second phosphor, the wavelength λ (which is indicated at the edge of the color diagram in FIG. 2) is related to energy E via E=(hc)/λ, where his Planck's constant and c is the speed of light. As illustrated in FIG. 2, a certain level of energy consumption is needed for the color conversion from one color point to another. Thus, a lower energy of the first illuminous color than the absorption energy of the second filling may ensure that, even if the first illuminous color passes through the second filling, the first illuminous color does not get converted by the second phosphor contained in the second filling. In other words, no color conversion may take place anymore in the second phosphor when the first illuminous color passes therethrough. By way of this, the separation between the first illuminous color and the second illuminous color may be even further enhanced.

Further, the convex surface of the water-drop shaped first filling may ensure that rays of the second illuminous color, for example, by forming tangent lines upon the convex surface of the first filling, may pre-dominantly pass over the convex surface thereof without passing through the first filling so as to avoid getting converted to the second illuminous color. By way of this, an undesired color mixture of the first illuminous color and the second illuminous color is reduced or even eliminated.

FIG. 4 is a diagram showing three embodiments of multi-color light sources. FIG. 4A illustrates a so-called sunny side up configuration of a multi-color light source. In the example illustrated in FIG. 4A, the light source includes a first LED die 20 covered by a first filling 60 containing a red phosphor and two second LED dies 40, 41 that are respectively covered by two second fillings 80, 81 both containing a white phosphor. Due to a circular radiation pattern, the top view illustrated in FIG. 4A is presented in the form of a sunny side up egg wherein the first illuminous color 26 being red is a full circle in the center and the second illuminous color 48 being white exists at an outer region surrounding the first illuminous color 26. Additionally, the radius of the region encompassing the perceived first illuminous color 26 may be different from the radius of the second filing 60, as a portion of side transmitted second illuminous color 48 may transmit through the first filling 60 and thus get converted. In particular, the radius of the first illuminous color 26 region compared with the radius of the sunny side up region perceived by the viewers may depend on the specific parameters of, for example, the convex surface of the first filling 60.

FIG. 4B illustrates a similar example to FIG. 4A. In the example illustrated in FIG. 4B, the light source includes two first LED dies 20, 21, which may be positioned at respectively the left and the right side of a second LED die 40. The first LED dies 20, 21 as well as the second LED die 40 may be covered by their respective fillings, which may include two first fillings 60, 61 and a second filling 80. The first fillings 60, 61 may each comprise a red phosphor whereas the second filling 80 may comprise a white phosphor. In the top view of this embodiment, the second illuminous color 48 is now presented in a center of the so-called inverted sunny side up configuration whereas the first illuminous color 26 may exist in an outer region. Therefore, according to FIGS. 4A and 4B, different color patterns are provided, which may contain two separate colors, and may fulfill versatile requirements to be met on automobiles.

It is also noted that in FIG. 4A as well as in FIG. 4B, two dams 90 are provided respectively at both ends of the two embodiments. These dams 90 may be configured for the purpose of further avoiding interference between adjacent light sources. In the case of FIG. 4A and 4B, there is illustrated merely one light source containing in total three LED dies. However, as will be explained later in the description, the manufacturing process may take place on a substrate that may encompass a plurality of light sources, which thus may necessitate the usage of dams configured between neighboring light sources to avoid interferences.

Nevertheless, referring to FIG. 4C, which shows another embodiment, the usage of dams 90 can also be avoided. FIG. 4C illustrates a similar embodiment to FIG. 4B, wherein in FIG. 4C no dams 90 are used since the two first LED dies 20, 21 are in the shape of a full hemisphere (waterdrop). More specifically, FIG. 4C illustrates complete hemispheres for the first fillings 60, 61, whereas in FIG. 4B the first fillings 60, 61 are in the shape only half of a hemisphere. Thus, in the case of FIG. 4C, the convex surface of the first fillings 60, 61 may automatically reduce and even exclude interferences between neighboring light sources, since any rays of light that propagate toward the surface of the first fillings 60, 61 from neighboring light sources form tangent lines upon the convex surfaces and thus merely pass over the surfaces without passing through the first fillings 60, 61. Therefore, apart from providing various multi-color lightings with reduced mix of different illuminous colors, embodiments described herein may also provide flexible ways of specific configurations depending on, for example, materials used for the fillings and specific parameters induced during specific manufacturing processes fulfilling the requirements of the expected lighting on the automobiles.

FIG. 4D shows another embodiment wherein a third LED die 42 covered by a third filling 83 is included in addition to a first LED die (not shown) and a second LED die (not shown) compared with FIGS. 4A-4C. In the top view illustrated in FIG. 4D, a first filling 60 and a plurality of second fillings 80, 81 and 82 are presented. The arrangement of the first filling 60 and the second fillings 80-82 may be similar to that as mentioned above except that, in FIG. 4D, instead of merely one complete second filling, a plurality of second fillings may be provided, each covering a respective second LED die. Of course, the colors of the respective phosphors included in the plurality of second fillings can either be the same or different depending on the specific multi-color pattern that is required. The separation of the second LED dies can be accomplished by using a plurality of dams. In particular, according to FIG. 4D, a third illuminous color may be provided after transmission of light through the third filling 83. Similar to the second illuminous color, the third illuminous color passes over the first filling 60 such that the third illuminous color may at least be physically/spatially separated from the first illuminous color.

Additionally, the third illuminous color may also pass over the third filling 80 and/or 82 for it to be further separated from the respective third fillings. Thus, a waterdrop shape can be employed for the first filling 60 and/or the second fillings 80-82. A plurality of dams can be applied between the first filling 60, the second fillings 80-82 and/or the third filling 83. Furthermore, undesired color conversion may not take place by, for instance, the first illuminous color being red (or amber) with the second illuminous color(s) being white while the third illuminous color is blue or cyan. Thus, by ensuring that the energy of the first illuminous color and/or the second illuminous color(s) is lower than that of the absorption energy of the third filling 83 (comprising the third phosphor if necessary), further improvement in color separation may be achieved. In addition, the third filling 83 can be transparent if using a blue third LED die 42. In the case of a cyan third die color, UV plus phosphor may be employed in the third LED die 42 for achieving cyan color. It may thus be achieved by the present invention to provide a three-color separation. Alternatively, any light emitted by a phosphor with a higher energy than the absorption energy of any other phosphor or phosphors may be arranged such that it does not pass through the other phosphor or phosphors, for example, by separating the fillings by one or more dams.

As mentioned above, the third illuminous color can be blue. In such or similar embodiments, the third illuminous color may be the same as the third die color. Therein, the third filling may be transparent and may contain no phosphor such that no color conversion may take place when the third die color passes through the third filling. It may thus also be ensured that the first illuminous color and the second illuminous color do not get converted by the third filling. Therefore, the multi-color separation provided by the embodiments described herein may not only provide for the separation of two colors but also the possibility of avoiding mixture between three different colors. Alternatively, the third filling may comprise a third phosphor to convert the third die color to a third illuminous color different from the first illuminous color and/or the second illuminous color.

In embodiments, the third die color may either be the same or different from the first die color and/or the second die color. For example, the first die color and the second die color can be blue while the third die color can be blue or cyan. When the third die color is cyan, the third illuminous color being cyan can be accomplished either directly by the die color (without conversion by a phosphor material where the third filling is transparent) or by the die color converted by a phosphor in the third filling. In embodiments, one or more of the first, second and third fillings may be silicone.

Figure 5:
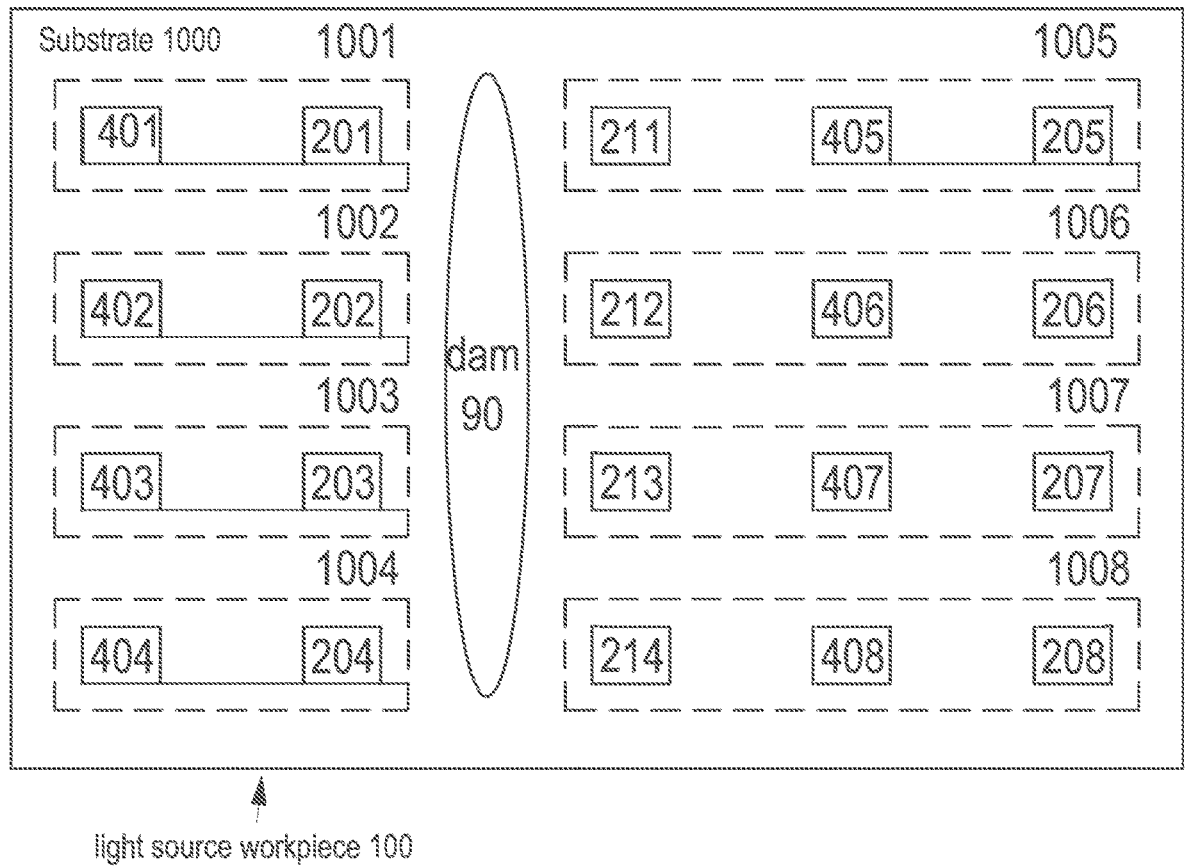
FIG. 5 is a diagram of a light source workpiece that is to be employed for manufacturing a plurality of light sources.

FIG. 5 is a diagram of a light source workpiece 100 that is to be employed for manufacturing a plurality of light sources. In embodiments, the light source workpiece may be a CoB light source workpiece. In the example illustrated in FIG. 5, a plurality of first LED dies 201-208 and 211-214 are arranged on a substrate 1000. FIG. 5 further illustrates that there are three strings of first LED dies, namely a string containing first LED dies 201-204, another string containing first LED dies 205-208 and a third string containing first LED dies 211-214, wherein the three strings of LED dies may be arranged in parallel with each other. Further, a plurality of second LED dies 401-408 may be arranged on the substrate 1000, wherein a first string of second LED dies containing second LED dies 401-404 may be arranged in parallel with a second string of second LED dies containing second LED dies 405-408. Further, it is presented in FIG. 5 that each row of LED dies may also be in parallel with each other. Such a parallel configuration of this embodiment may serve to simplify the manufacturing process such that, for instance, the depositing of filling materials as well as the dicing of separate light sources may be eased with reduced complexity and costs. Therefore, as illustrated in FIG. 5, there is provided a plurality of light sources 1001-1008. Therein, light sources 1001-1004 may each comprise a first LED die and a second LED die whereas light sources 1005-1008 may each comprise two of the first LED dies and one second LED die. Furthermore, in order to avoid interferences between adjacent light sources, for instance, between light source 1001 and light source 1005, a dam 90 may be arranged on the substrate 1000 as well.

In embodiments, the workpiece may also include a plurality of third LED dies. The plurality of third LED dies may be arranged on the substrate and covered by a third filling. In this case, each light source may further comprise at least one third LED die such that a multi-color lighting without interference between the three colors may be provided.

In embodiments, a plurality of dams may be arranged on the substrate between neighboring light sources such that a multi-color light emitted by each light source may not interfere with its neighboring light sources.

Use of CoB technology may enable configuration of a plurality of light sources on a substrate that contains multiple LED dies. The deposit of the first filling and the second filling can thus be applied for the batch of light sources, which may greatly increase the manufacturing efficiency and reduce costs. In other words, it may no longer be necessary to separately arrange the fillings over single LEDs nor to package the LEDs independently. It may thus be advantageous that light sources, taking up less space and requiring lower costs and in the meantime exhibiting effective color separation of at least two colors, can be highly efficiently produced by employing CoB technology.

Figure 6:
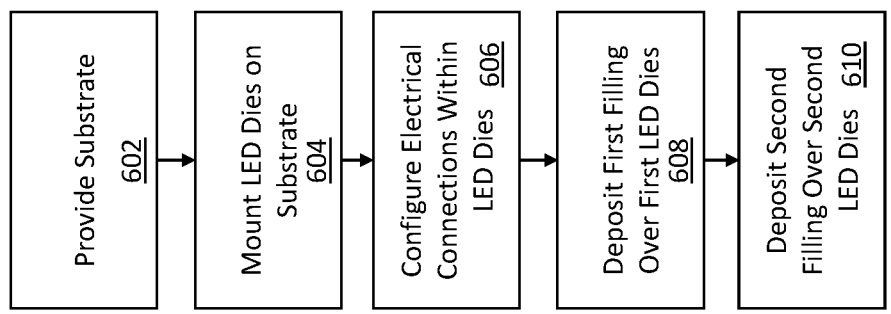
FIG. 6 is a flow diagram of a method of manufacturing a light source workpiece.

FIG. 6 is a flow diagram of an example method of manufacturing a light source workpiece. In the example illustrated in FIG. 6, the method includes providing a substrate (602). A plurality of LED dies may be mounted on the substrate (604). As mentioned above, the plurality of LED dies may be mounted in such a manner that each row of LED dies may be in parallel with each other and each column of LED dies may be in parallel with each other as well. Thereafter, it is within the expertise of the skilled person according to specific requirements of the lighting to be manufactured that a plurality of light sources may be arranged. For instance, according to FIG. 5, the LED dies 201-204 may be evenly arranged in one column, which may be to the right of a plurality of second LED dies 401-404, such that four light sources 1001-1004 with the same configuration may be formed. Another plurality of light sources 1005-1008 may be formed in a similar manner wherein a plurality of second LED dies 405-408 may be arranged in the middle column whereas first LED dies 205-208 may be arranged to the right thereof and first LED dies 211-214 may be arranged to the left thereof.

Electrical connections within the plurality of LED dies may be configured (606). Fillings may be deposited over the respective plurality of LED dies on the substrate. In particular, a first filling may be deposited over a first plurality of LED dies (608). In embodiments, the first plurality of LED dies may be, for example, the plurality of first LED dies 201-204, 205-208 and 211-214 illustrated in FIG. 5. It is thus apparent that the configuration illustrated in FIG. 5 may ease the depositing of the first filling. Similarly, a second filling may be deposited over a second plurality of LED dies (610).

In embodiments, the second plurality of LED dies may be, for example, the plurality of second LED dies 401-404 and 405-408 illustrated in FIG. 5. Additionally, in the case that there exists a plurality of third LED dies on the substrate for the formation of a three-color light, a third filling may also be deposited (not shown in FIG. 6) in a similar manner as described above. Electrical connections between all of the plurality of LED dies and the substrate may be arranged, if necessary.

In embodiments, the electrical connections within the plurality of LED dies (606) may be configured simultaneously to depositing the fillings (608/610) or before or after depositing the fillings (608/610).

In practice, it may also be necessary to apply a curing to the respective filling. More specifically, a respective curing may be applied to the first filling, the second filling and the third filling. It is also within the expertise of the skilled person to decide whether he needs to apply a curing to each, some or even all of the fillings. Additionally, curing materials and related techniques are known to the person skilled in the art and, thus, the embodiments described herein may not be limited to any specific material or technique applied. By way of example, in some embodiments, curing may be performed using an oven or by ultraviolet (UV) radiation.

Furthermore, in some embodiments, a plurality of dams 90 may be deposited between neighboring light sources. Take FIG. 5 as an example, and supposing that light sources 1001-1004 all exhibit the same sunny side up red-white light whereas the light sources 1005-1008 all exhibit an inverted sunny side up red-white light, a dam 90 may be deposited between light sources 1001-1004 and light sources 1005-1008 (please refer to FIG. 4B for a similar illustration). By way of this, interferences between neighboring light sources can also be avoided in a way that is of less complexity and lower costs.

In summary, the plurality of LED dies may be arranged in such a manner that a plurality of light sources may be formed on the light source workpiece. Therein each light source may comprise at least one first LED die and at least one second LED die such that at least a two-color pattern with an effective separation of the multiple colors may be achieved. Each light source may also comprise at least one third LED die such that a three-color lighting may be achieved. Thus, a plurality of multi-color light sources may be easily manufactured wherein the number of method steps, the complexity as well as the costs of the manufacturing process may be significantly reduced. In the meantime, each light source may exhibit a clear—cut color separation between different illuminous colors, and interferences between neighboring light sources during the manufacturing process may be avoided without increasing manufacturing complexity and costs. A highly efficient manufacturing process for the production of a plurality of versatile multi-color light sources may thus be provided, and a plurality of multi-color light sources may be easily manufactured wherein the number of method steps, the complexity as well as the costs of the manufacturing process may be significantly reduced. In the meantime, each light source may exhibit a clear—cut color separation between different illuminous colors, and interferences between neighboring light sources during the manufacturing process may be avoided without increasing manufacturing complexity and costs.

Figure 7:
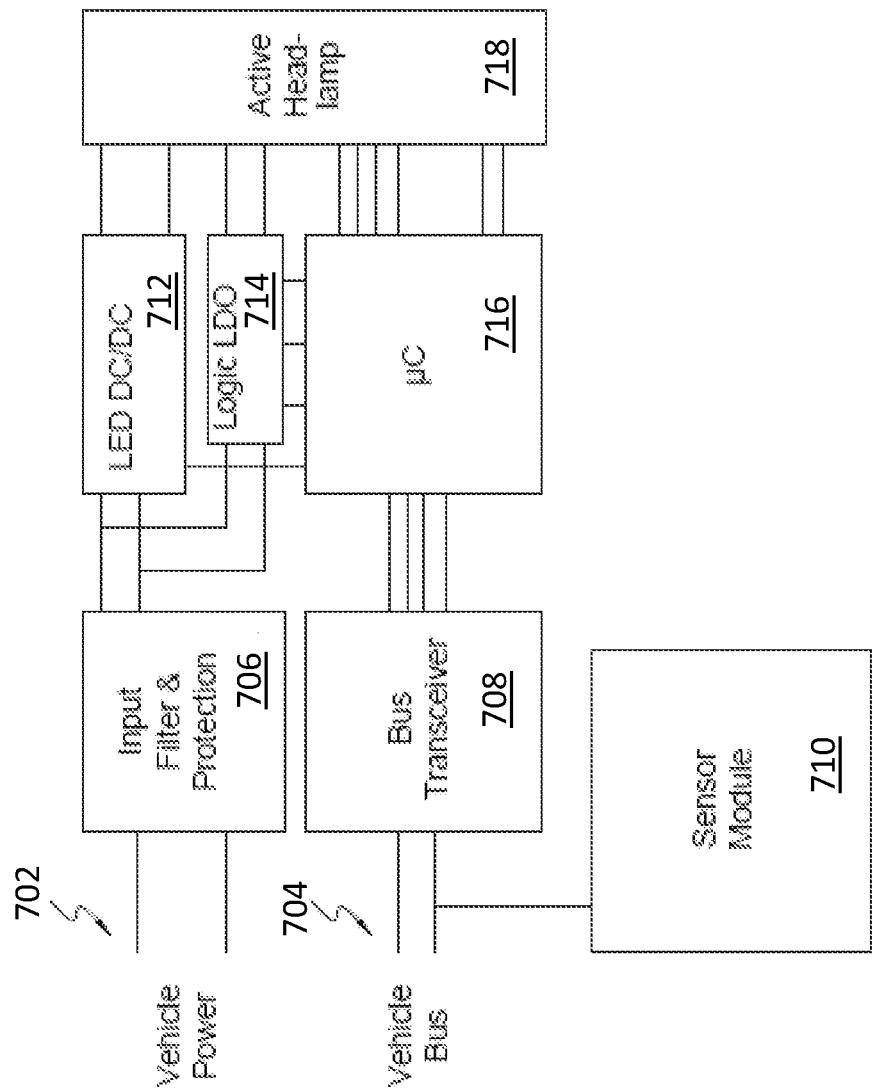
FIG. 7 is a diagram of an example vehicle headlamp system.

FIG. 7 is a diagram of an example vehicle headlamp system 700 that may incorporate one or more of the embodiments and examples described herein. The example vehicle headlamp system 700 illustrated in FIG. 7 includes power lines 702, a data bus 704, an input filter and protection module 706, a bus transceiver 708, a sensor module 710, an LED direct current to direct current (DC/DC) module 712, a logic low-dropout (LDO) module 714, a micro-controller 716 and an active head lamp 718. In embodiments, the active head lamp 718 may be a signal lamp, which may, potentially in combination with other components of the vehicle headlamp system 700 and/or automobile components external to the vehicle headlamp system 700, be configured to implement multiple lighting functions at the same time, or at different times, and may be used, in some embodiments, to ensure that various safety regulations can be met.

The power lines 702 may have inputs that receive power from a vehicle, and the data bus 704 may have inputs/outputs over which data may be exchanged between the vehicle and the vehicle headlamp system 700. For example, the vehicle headlamp system 700 may receive instructions from other locations in the vehicle, such as instructions to turn on turn signaling or turn on headlamps, and may send feedback to other locations in the vehicle if desired. In embodiments, the active headlamp 718 may include one or more multi-color light source, as described above with respect to FIGS. 1-4, for example. The instructions may corresponding include, for example, an instruction to turn on one of multiple functions to be implemented by the multi-color light source of a signal lamp, such as an instruction to turn on Daytime Running Lamps (DRL), a turn signal instruction or a backup instruction. In such embodiments, at least the micro-controller 716, the LED DC/DC module 712 and the sensor module 710 may be activated to control and drive certain emitters in the multi-color light source such that one multi-color light source may be used to implement one of multiple functions. In embodiments, a signal lamp, multi-color light source, or other vehicle light source may be configured to implement two or more functions, such as DRL and Turn Light, Position Lamp and Turnlight, or DRL, Turn Light and Position Lamp. The instructions may instruct modules in the vehicle lighting system 700 to implement one of the two or more functions the lamp and/or light source is configured to implement.

The sensor module 710 may be communicatively coupled to the data bus 704 and may provide additional data to the vehicle headlamp system 700 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 700. In FIG. 7, the headlamp controller may be a micro-controller, such as micro-controller (µc) 716. The micro-controller 716 may be communicatively coupled to the data bus 704.

The input filter and protection module 706 may be electrically coupled to the power lines 702 and may, for example, support various filters to reduce conducted emissions and provide power immunity. Additionally, the input filter and protection module 706 may provide electrostatic discharge (ESD) protection, load-dump protection, alternator field decay protection, and/or reverse polarity protection.

The LED DC/DC module 712 may be coupled between the input filter and protection module 706 and the active headlamp 718 to receive filtered power and provide a drive current to power LEDs in the LED array in the active headlamp 718. The LED DC/DC module 712 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 714 may be coupled to the input filter and protection module 706 to receive the filtered power. The logic LDO module 714 may also be coupled to the micro-controller 716 and the active headlamp 718 to provide power to the micro-controller 716 and/or electronics in the active headlamp 718, such as CMOS logic.

The bus transceiver 708 may have, for example, a universal asynchronous receiver transmitter (UART) or serial peripheral interface (SPI) interface and may be coupled to the micro-controller 716. The micro-controller 716 may translate vehicle input based on, or including, data from the sensor module 710. The translated vehicle input may include a video signal that is transferrable to an image buffer in the active headlamp 718. In addition, the micro-controller 716 may load default image frames and test for open/short pixels during startup. In embodiments, an SPI interface may load an image buffer in CMOS. Image frames may be full frame, differential or partial frames. Other features of micro-controller 716 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 8:
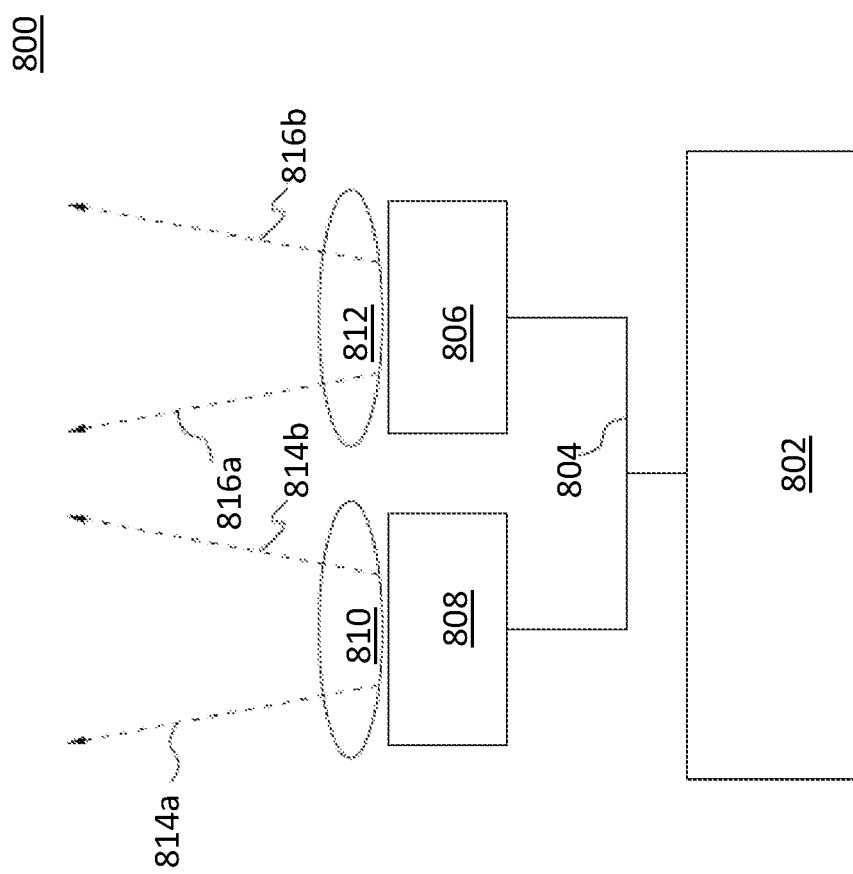
FIG. 8 is a diagram of another example vehicle headlamp system.

FIG. 8 is a diagram of another example vehicle headlamp system 800. The example vehicle headlamp system 800 illustrated in FIG. 8 includes an application platform 802, two LED lighting systems 806 and 808, and secondary optics 810 and 812.

The LED lighting system 808 may emit light beams 814 (shown between arrows 814a and 814b in FIG. 8). The LED lighting system 806 may emit light beams 816 (shown between arrows 216a and 816b in FIG. 8). In the embodiment shown in FIG. 8, a secondary optic 810 is adjacent the LED lighting system 808, and the light emitted from the LED lighting system 808 passes through the secondary optic 810. Similarly, a secondary optic 812 is adjacent the LED lighting system 806, and the light emitted from the LED lighting system 806 passes through the secondary optic 812. In alternative embodiments, no secondary optics 810/812 are provided in the vehicle headlamp system.

Where included, the secondary optics 810/812 may be or include one or more light guides or reflectors, which may enable a multi-color pattern emitted by the light source to be reflected such that drivers and pedestrians can better recognize the vehicle even in low light intensity and/or to provide flexible and specified lighting with multiple colors. The one or more light guides may be edge lit or may have an interior opening that defines an interior edge of the light guide. LED lighting systems 808 and 806 may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 808 and 806 in a desired manner, such as, for example, with a gradient, a chamfered distribution, a narrow distribution, a wide distribution, or an angular distribution.

The application platform 802 may provide power and/or data to the LED lighting systems 806 and/or 808 via lines 804, which may include one or more or a portion of the power lines 702 and the data bus 704 of FIG. 7. One or more sensors (which may be the sensors in the vehicle headlamp system 800 or other additional sensors) may be internal or external to the housing of the application platform 802. Alternatively, or in addition, as shown in the example vehicle headlamp system 700 of FIG. 7, each LED lighting system 808 and 806 may include its own sensor module, connectivity and control module, power module, and/or LED array.

In embodiments, the vehicle headlamp system 800 may represent an automobile with steerable light beams where LEDs may be selectively activated to provide steerable light. For example, an array of LEDs or emitters may be used to define or project a shape or pattern or illuminate only selected sections of a roadway. In an example embodiment, infrared cameras or detector pixels within LED lighting systems 806 and 808 may be sensors (e.g., similar to sensors in the sensor module 710 of FIG. 7) that identify portions of a scene (e.g., roadway or pedestrian crossing) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light source, comprising:
   a substrate;
   a first light emitting diode (LED) die having a bottom surface on the substrate and configured to emit light having a first die color when turned on;
   a first dome-shaped filling completely surrounding all surfaces of the first LED die except the bottom surface, the first filling comprising a first phosphor such that the light having the first die color is converted to light having a first illuminous color when the first LED die is turned on;
a second LED die spaced apart from the first LED die, having a bottom surface on the substrate, and configured to emit light having a second die color when the second LED die is turned on; and
a second filling completely surrounding all surfaces of the second LED die except the bottom surface and extending to the first dome-shaped filling while leaving at least a portion of a top surface of the first dome-shaped filling exposed from the second filling, the second filling comprising a second phosphor such that, when the first and second LED dies are turned on, the light having the second die color is converted to light having a second illuminous color that has a higher absorption energy than an illumination energy of the first illuminous color and passes around the first dome-shaped filling unconverted by the first dome-shaped filling.

2. The light source of claim 1, wherein at least one of the first die color is blue or the second die color is blue.

3. The light source of claim 2, wherein the first illuminous color is one of red or amber and the second illuminous color is white.

4. The light source of claim 2, wherein the first illuminous color is one of white, red, or amber, and the second illuminous color is cyan.

5. The light source of claim 1, further comprising:
a third LED die configured to emit a third die color; and
a third filling over the third LED die such that a third illuminous color is provided.

6. The light source of claim 5, wherein at least one of the third illuminous color passes over the first filling or the second filling such that at least one of the third illuminous color is separated from the first illuminous color or the second illuminous color.

7. The light source of claim 5, wherein the first illuminous color is one of red or amber, the second illuminous color is white, and the third illuminous color is one of blue or cyan.

8. The light source of claim 5, wherein the first filling, the second filling and the third filling further comprise silicone.

9. A light source workpiece for manufacturing a plurality of light sources, the light source workpiece comprising:
a substrate;
a plurality of first LED dies having bottom surfaces on the substrate and configured to emit light having a first die color when at least one of the plurality of first LED dies is turned on, and covered by a first dome-shaped filling on all surfaces except the bottom surface, the first dome-shaped filling comprising a first phosphor such that the light having the first die color is converted to light having a first illuminous color when at least one of the plurality of first LED dies is turned on; and
a plurality of second LED dies having bottom surfaces on the substrate and configured to emit light having a second die color when at least one of the plurality of second LED dies is turned on, and covered by a second filling, the second filling extending to the first dome-shaped filling, while leaving at least a portion of a top surface of the first dome-shaped filling exposed from the second filling, and comprising a second phosphor such that the light having the second die color is converted to light having a second illuminous color that has a higher absorption energy than an illumination energy of the first illuminous color and passes around the first dome-shaped filling unconverted by the first dome-shaped filling,
each light source of the light source workpiece comprising at least one of the plurality of first LED dies and at least one of the plurality of second LED dies.

10. The light source workpiece of claim 9, further comprising:
a plurality of dams arranged on the substrate between neighboring light sources such that a multi-color lighting emitted by each light source does not interfere with its neighboring light sources.

11. The light source workpiece of claim 9, further comprising:
a plurality of third LED dies arranged on the substrate and covered by a third filling, each light source of the light source workpiece further comprising at least one of the plurality of third LED dies.

12. The light source workpiece of claim 11, wherein at least one of the plurality of first LED dies, the plurality of second LED dies, or the plurality of third LED dies are arranged in parallel.

13. A multi-function signal lamp comprising:
a multi-color light source comprising:
a substrate;
a plurality of first light emitting diode (LED) dies having bottom surfaces on the substrate and configured to emit a first die color when turned on,
a first dome-shaped filling completely surrounding all surfaces of the plurality of first LED dies except the bottom surfaces, the first filling comprising a first phosphor such that the light having the first die color is converted to light having a first illuminous color when at least one of the first plurality of LED dies is turned on,
a plurality of second LED dies spaced apart from the first plurality of LED dies, having bottom surfaces on the substrate, and configured to emit light having a second die color when at least one of the plurality of second LED dies is turned on, and
a second filling completely surrounding all surfaces of the plurality of second LED dies except the bottom surface and extending to the first dome-shaped filling, the second filling comprising a second phosphor such that when the first and second plurality of LED dies are turned on, the light having the second die color is converted to light having a second illuminous color that has a higher absorption energy than an illumination energy of the first illuminous color and passes around the first dome-shaped filling unconverted by the first dome-shaped filling; and
a controller configured to receive an instruction to activate one of a plurality of lighting functions for the multi-color light source and, in response to the instruction, control the multi-color light source to turn on at least two of the plurality of first LED dies or at least two of the plurality of second LED dies in a predetermined pattern, wherein the plurality of lighting functions comprises at least two of Daytime Running Lamp, Turn light, or Position Lamp.

14. A method of manufacturing a lighting source workpiece comprising the steps of:
providing a substrate;
mounting a plurality of LED dies with bottom surfaces of the plurality of LEDs on the substrate, the plurality of LED dies being divided into at least a plurality of first LED dies and a plurality of second LED dies, the first plurality of LED dies configured to emit light having a first die color when turned on and the second plurality of LED dies configured to emit light having a second die color when turned on;

configuring electrical connections within the plurality of LED dies;

depositing a first dome-shaped filling over the plurality of first LED dies such that the first dome-shaped filling completely surrounds all surfaces of the plurality of first LED dies except the bottom surfaces, the first filling comprising a first phosphor such that the light having the first die color is converted to a first illuminous color when at least one of the plurality of first LEDs is turned on; and depositing a second filling such that the second filling completely surrounds all surfaces of the plurality of second LED dies except the bottom surfaces and extends to the first dome-shaped filling while leaving at least a portion of a top surface of the first dome-shaped filling exposed from the second filling, the second filling comprising a second phosphor such that, when at least one of the plurality of second LEDs is turned on, the light having the the second die color is converted to a second illuminous color that has a higher absorption energy than an illumination energy of the first illuminous color and the light having the second die color passes over the first dome-shaped filling unconverted by the first dome-shaped filling.

15. The method of claim 14, wherein the mounting the plurality of LED dies on the substrate further comprising arranging the plurality of LED dies in such a way that a plurality of light sources is formed, each of the plurality of light sources comprising at least one first LED die and at least one second LED die, the method further comprising the step of:

depositing a plurality of dams between neighboring light sources such that a multi- color lighting emitted by each light source does not interfere with its neighboring lighting sources.

16. The method of claim 14, wherein the plurality of LED dies further comprises a plurality of third LED dies, the method further comprising the step of:

depositing a third filling over the plurality of third LED dies.

17. The method of claim 16, wherein at least one of the first plurality of LED dies, the second plurality of LED dies or the third plurality of LED dies are arranged in parallel.

18. The method of claim 14, further comprising the step of:

curing the first filling and the second filling.

* * * * *